United States Patent
Ohayon et al.

(10) Patent No.: US 10,515,187 B2
(45) Date of Patent: Dec. 24, 2019

(54) ARTIFICIAL INTELLIGENCE (AI) TECHNIQUES FOR LEARNING AND MODELING INTERNAL NETWORKS

(71) Applicant: Symantec Corporation, Mountain View, CA (US)

(72) Inventors: Almog Ohayon, Tel Aviv (IL); Guy Franco, Tel Aviv (IL); Roi Abutbul, Be'er Sheva (IL)

(73) Assignee: Symantec Corporation, Mountain View, CA (US)

( * ) Notice: Subject to any disclaimer, the term of this patent is extended or adjusted under 35 U.S.C. 154(b) by 224 days.

(21) Appl. No.: 15/637,765

(22) Filed: Jun. 29, 2017

(65) Prior Publication Data

US 2018/0004870 A1     Jan. 4, 2018

Related U.S. Application Data

(60) Provisional application No. 62/356,391, filed on Jun. 29, 2016.

(51) Int. Cl.
    *G06F 15/173*     (2006.01)
    *G06F 17/50*     (2006.01)
    (Continued)

(52) U.S. Cl.
    CPC .......... *G06F 17/509* (2013.01); *G06N 20/00* (2019.01); *H04L 41/12* (2013.01); *H04L 41/145* (2013.01); *H04L 41/16* (2013.01); *H04L 41/0866* (2013.01); *H04L 61/1505* (2013.01); *H04L 61/255* (2013.01)

(58) Field of Classification Search
CPC combination set(s) only.
See application file for complete search history.

(56) References Cited

U.S. PATENT DOCUMENTS 6,981,155 B1    12/2005   Lyle et al.
7,117,532 B1    10/2006   Lyle et al.
(Continued)

OTHER PUBLICATIONS

U.S. Appl. No. 15/588,280, of Ohayon, A., et al., filed May 5, 2017.
(Continued)

*Primary Examiner* — John B Walsh
(74) *Attorney, Agent, or Firm* — Patent Law Works LLP

(57) ABSTRACT

Introduced here are techniques for modeling networks in a discrete manner. More specifically, various embodiments concern a virtual machine that collects data regarding a network and applies algorithms to the data to discover network elements, which can be used to discover the topology of the network and model the network. The algorithms applied by the virtual machine may also recognize patterns within the data corresponding to naming schemes, subnet structures, application logic, etc. In some embodiments, the algorithms employ artificial intelligence techniques in order to more promptly respond to changes in the data. The virtual machine may only have read-only access to certain objects residing within the network. For example, the virtual machine may be able to examine information hosted by a directory server, but the virtual machine may not be able to effect any changes to the information.

22 Claims, 7 Drawing Sheets

(51) Int. Cl.
*G06N 20/00* (2019.01)
*H04L 12/24* (2006.01)
*H04L 29/12* (2006.01)

(56) References Cited

U.S. PATENT DOCUMENTS

| | | | |
|---|---|---|---|
| 7,152,239 B1 | 12/2006 | Lyle et al. | |
| 7,461,402 B1 | 12/2008 | Lyle et al. | |
| 8,528,091 B2 * | 9/2013 | Bowen | G06F 21/566 |
| | | | 726/24 |
| 8,738,639 B1 | 5/2014 | Zafar et al. | |
| 9,306,940 B2 | 4/2016 | Brock | |
| 10,110,629 B1 | 10/2018 | Kruse et al. | |
| 10,225,284 B1 | 3/2019 | Evans et al. | |
| 2002/0046351 A1 | 4/2002 | Takemori et al. | |
| 2002/0066034 A1 | 5/2002 | Schlossberg et al. | |
| 2002/0095607 A1 | 7/2002 | Lin-Hendel | |
| 2002/0157021 A1 | 10/2002 | Sorkin et al. | |
| 2002/0162017 A1 | 10/2002 | Sorkin et al. | |
| 2005/0187894 A1 | 8/2005 | Pletcher et al. | |
| 2006/0026682 A1 | 2/2006 | Zakas | |
| 2006/0149674 A1* | 7/2006 | Cook | G06Q 20/40 |
| | | | 705/44 |
| 2006/0174323 A1 | 8/2006 | Brown et al. | |
| 2007/0282768 A1 | 12/2007 | Chang et al. | |
| 2007/0289018 A1 | 12/2007 | Steeves et al. | |
| 2010/0077483 A1* | 3/2010 | Stolfo | G06F 21/554 |
| | | | 726/24 |
| 2012/0030576 A1 | 2/2012 | Bell et al. | |
| 2013/0151607 A1 | 6/2013 | Faller et al. | |
| 2013/0263226 A1 | 10/2013 | Sudia | |
| 2015/0012567 A1 | 1/2015 | Powell et al. | |
| 2015/0012571 A1 | 1/2015 | Powell et al. | |
| 2015/0213032 A1 | 7/2015 | Powell et al. | |
| 2015/0326608 A1* | 11/2015 | Shabtai | H04L 67/306 |
| | | | 726/23 |
| 2016/0026798 A1 | 1/2016 | Martini et al. | |
| 2017/0109370 A1 | 4/2017 | Newhouse | |
| 2017/0134423 A1 | 5/2017 | Sysman et al. | |
| 2017/0171244 A1 | 6/2017 | Vissamsetty et al. | |
| 2017/0195346 A1 | 7/2017 | Be'ery et al. | |
| 2017/0206353 A1 | 7/2017 | Jai et al. | |
| 2017/0289191 A1 | 10/2017 | Thioux et al. | |
| 2017/0339185 A1 | 11/2017 | Rozenshein et al. | |
| 2017/0366563 A1 | 12/2017 | Volfman et al. | |
| 2018/0152477 A1 | 5/2018 | Kakumaru | |
| 2018/0159897 A1 | 6/2018 | Kakumaru | |
| 2018/0255078 A1 | 9/2018 | Papillon et al. | |
| 2019/0089737 A1 | 3/2019 | Shayevitz et al. | |

OTHER PUBLICATIONS

U.S. Appl. No. 15/649,512, of Ohayon, A., et al., filed Jul. 13, 2017.
U.S. Appl. No. 15/654,425, of Ohayon, A., et al., filed Jul. 19, 2017.

* cited by examiner

300

301 Install a virtual machine on a computing device within a network

302 Communicatively couple the virtual machine to at least one network device

303 Execute algorithm(s) to model network element(s)

304 Perform a system operation

305 Monitor whether changes are made to the network elements

306 Update model in real time as necessary

FIG. 3

ARTIFICIAL INTELLIGENCE (AI) TECHNIQUES FOR LEARNING AND MODELING INTERNAL NETWORKS

CROSS-REFERENCE TO RELATED APPLICATIONS

This application claims priority to U.S. Provisional Patent Application No. 62/356,391, titled "ARTIFICIAL INTELLIGENCE (AI) TECHNIQUES FOR LEARNING AND MODELING INTERNAL NETWORKS" and filed on Jun. 29, 2016, which is incorporated by reference herein in its entirety.

FIELD OF THE INVENTION

Various embodiments pertain to computer-implemented security techniques and, more specifically, to algorithm-based techniques for learning the topology of a network and then modeling the network.

BACKGROUND

A computer network (also referred to simply as a "network") is a telecommunications network that allows nodes to share resources. More specifically, a computer network is a collection of nodes that are interconnected by communication channels, which allow data and resources to be shared. Examples of nodes include modems, hubs, bridges, switches, routers, servers, computers, mobile phones, etc. The communication channels between the nodes can be established using either wired media or wireless media.

Home networks (e.g., residential Local Area Networks) are typically used to facilitate communication between computing devices installed or used in a home, such as printers, tablet computers, and mobile phones. Enterprise networks, meanwhile, normally enable employees to access vital programs and data that are necessary for the day-to-day operations of an enterprise (e.g., a company). Enterprise networks held connect computing devices across different departments and geographical locations (and, in some instances, workgroup sub-networks), thereby facilitating data accessibility.

Computer networks (regardless of type) could be analyzed for a variety of reasons. For example, an administrator may be interested in measuring bandwidth or throughput, determining network robustness, tracking network uptime, detecting security threats, etc. Such analysis is typically more useful when the topology of the computer network is known. However, it is often difficult to gain an accurate understanding of the network topology, particularly for those computer networks (e.g., enterprise networks) whose make-up changes over time.

BRIEF DESCRIPTION OF THE DRAWINGS

Embodiments of the present invention are illustrated by way of example and not limitation in the accompanying drawings, in which like references indicate similar elements. Various objects, features, and characteristics of the present invention will become more apparent to those skilled in the art from a study of the Detailed Description in conjunction with the accompanying drawings.

FIG. 3 depicts a flow diagram of a process for implementing a virtual machine that employs different algorithm(s) to learn the internal topology of a network.

Figure 1:
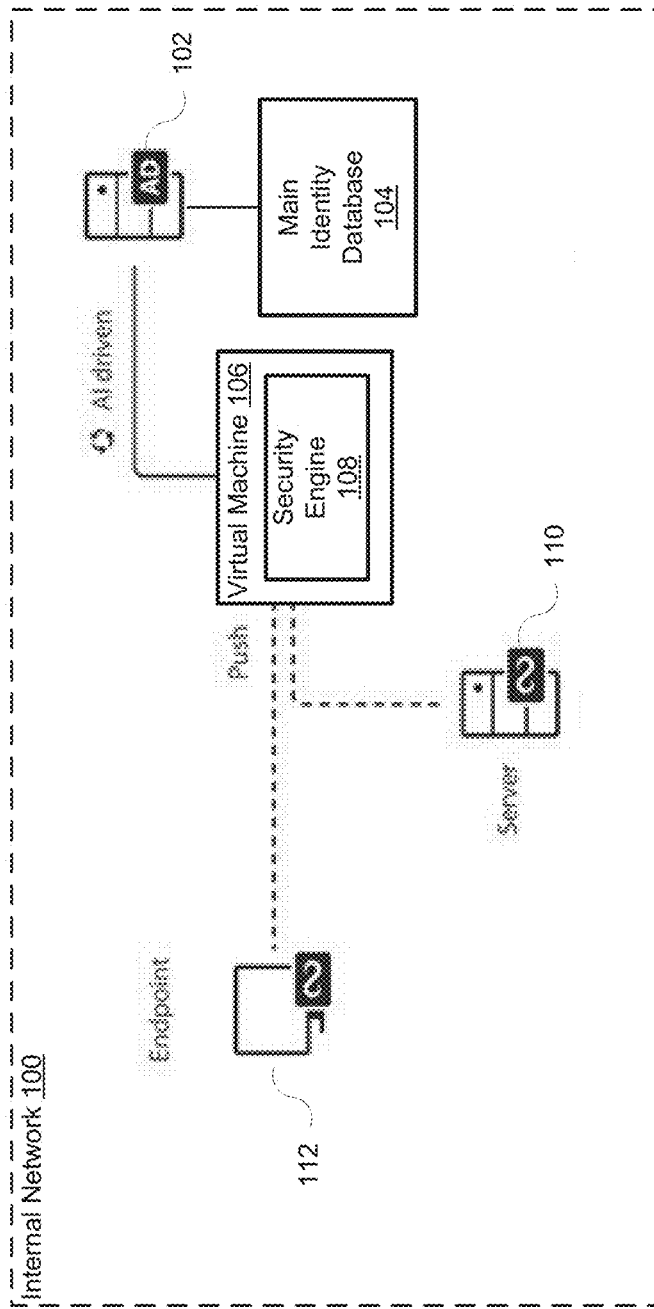
FIG. 1 is a generalized illustration of an internal network (e.g., enterprise network).

The figures depict various embodiments for the purpose of illustration only. One skilled in the art will readily recognize that alternative embodiments of the technology described herein may be employed without departing from the principles of the present invention.

DETAILED DESCRIPTION

Computer networks (e.g., internal networks such as enterprise networks) often include multiple computing devices that seek to access data. Each computing device executes an operating system (e.g., Microsoft Windows®, Apple OS X®, or Linux® and its variants) that is responsible for, among other things, interfacing with other computing devices and enforcing security policies.

Computer networks are continually/periodically analyzed for a variety of reasons. For example, an administrator may be interested in measuring bandwidth or throughput, determining network robustness, tracking network uptime, detecting security threats, etc. The administrator may be associated with an individual computing device within a computer network, or the administrator could be responsible for monitoring the computer network as a whole.

Such forms of analysis are more useful when the topology of the computer network is known. For example, if an administrator discovers that a computing device has been accessed by an unauthorized entity (also referred to as a "hacker"), the administrator may wish to know what databases the computing device is able to access, what other computing devices the computing device is communicatively coupled to, etc. Examples of unauthorized entities include individuals and malicious software ("malware") that exists on one or more of the computing devices that reside within a computer network. However, it is often difficult to gain an accurate understanding of network topology, particularly for those computer networks (e.g., enterprise networks) whose make-up changes over time.

Introduced here, therefore, are computer-implemented security techniques for internal networks (as well as other systems) that are accessible only to a limited set of authorized users (e.g., employees of the enterprise). More specifically, various embodiments pertain to learning the topology of an internal network to discover one or more network elements, and then modeling the network element(s). For example, a virtual machine could be installed in the internal network and permitted to access a directory server that includes a database of identities associated with authorized users of the internal network. Upon accessing the directory server, the virtual machine can learn the topology of the internal network. Moreover, in some embodiments, the virtual machine models the internal network based on the learned topology. Generally, the virtual machine will have read-only access to the directory server (i.e., the virtual machine will not be able to effect changes to the database of identities).

Once the virtual machine has been installed and configured, one or more algorithms can be executed that assist in modeling network elements. In some embodiments, and the virtual machine (or another virtual machine) may create new network elements for the purpose of deception. For example, the virtual machine could use the database of identities to model the network (e.g., by applying artificial intelligence (AI), data mining, and/or machine learning techniques). More specifically, the virtual machine can collect data associated with a computer network (e.g., regarding users, applications, services, and/or network topology), and then analyze the data using one or more algorithms.

The algorithm(s) can be used to recognize patterns within the data. For example, the virtual machine may discover certain naming patterns, site name and/or subnet patterns, or application/attribute patterns. Some or all of the discovered pattern(s) can be used by the virtual machine to mask subsequent tasks that are performed by the virtual machine. For example, the virtual machine may craft an executable with masked topology (e.g., user objects, computer objects, or server objects).

The algorithm(s) typically facilitate two-way communication between the virtual machine and the directory server. Thus, once objects have been modified (e.g., added, removed, or changed) in the database of identities, the virtual machine can execute the algorithm(s) to update the network model, craft executables based on the network model, etc.

These techniques may later be used to protect a computer network from both external sources and internal sources (e.g., as part of a proprietary deception technique developed for a particular environment, such as a Microsoft Windows® operating system, Apple OS X® operating system, or a Linux-based operating system). Oftentimes, the techniques described herein will be tailored for one or more particular environments. Similarly, embodiments may be described with reference to certain system configurations or networks (e.g., internal networks for enterprises). However, those skilled in the art will recognize that features of the techniques are transferrable across different environments, system configurations, network types, network topologies, etc.

Moreover, the techniques introduced herein can be implemented by programmable circuitry (e.g., one or more microprocessors) appropriately programmed with software and/or firmware, special-purpose hardwired (i.e., non-programmable) circuitry, or a combination of such forms. Special-purpose circuitry can be in the form of one or more application-specific integrated circuits (ASICs), programmable logic devices (PLDs), field-programmable gate arrays (FPGAs), etc. Accordingly, embodiments may include a machine-readable medium storing instructions that may be used to program a computing device to perform a process. The machine-readable medium may include, but is not limited to, floppy diskettes ("disks") and other removable disks, optical disks, compact disk read-only memories (CD-ROMs), magneto-optical disks, read-only memories (ROMs), random access memories (RAMs), erasable programmable read-only memories (EPROMs), electrically erasable programmable read-only memories (EEPROMs), magnetic/optical cards, flash memory, or another type of machine-readable medium suitable for storing instructions.

Terminology

Brief definitions of terms, abbreviations, and phrases used throughout the specification are given below.

Reference in this specification to "one embodiment" or "an embodiment" means that a particular feature, structure, or characteristic described in connection with the embodiment is included in at least one embodiment of the disclosure. The appearances of the phrase "in some embodiments" are not necessarily referring to the same embodiments, nor are they necessarily referring to separate or alternative embodiments that are mutually exclusive of one another. Moreover, various features are described that may be exhibited by some embodiments but not others. Similarly, various requirements are described that may be requirements for some embodiments but not others.

Unless the context clearly requires otherwise, the words "comprise" and "comprising" are to be construed in an inclusive sense rather than an exclusive or exhaustive sense (i.e., in the sense of "including, but not limited to"). The terms "connected," "coupled," or any variant thereof includes any connection or coupling between two or more elements, either direct or indirect. The coupling or connection between the elements can be physical, logical, or a combination thereof. For example, two devices may be coupled directly to one another or via one or more intermediary channels/devices. Devices may also be coupled in such a way that information can be passed there between, despite not sharing any physical connection with one another. The words "associate with," meanwhile, mean connecting or relating objects, items, etc.

Where the context permits, words used in the singular sense or the plural sense may also be used in the plural sense or the singular sense, respectively. The word "or," in reference to a list of two or more items, covers all of the following interpretations of the word: any of the items in the list, all of the items in the list, and any combination of the items in the list. If the specification states a component or feature "may," "can," "could," or "might" be included or have a characteristic, that particular component or feature is not required to be included or have the characteristic in every embodiment.

The term "module" refers broadly to software, hardware, and/or firmware components. Modules are typically functional components that can generate useful data or other output using specified input(s). A module may or may not be self-contained. A software program or application may include one or more modules.

The terminology used in the Detailed Description is intended to be interpreted in its broadest reasonable manner, even though it is being used in conjunction with certain embodiments. The terms used in this specification generally have their ordinary meanings in the art, in the context of the disclosure as a whole and in the specific context where each term is used. For convenience, certain terms may be highlighted using, for example, capitalization, italics, and/or quotation marks. However, the use of highlighting has no influence on the scope and meaning of a term. The scope and meaning of a term is the same, in the same context, whether or not it is highlighted.

Consequently, although alternative language and synonyms may be used for some terms, special significance is not to be placed upon whether or not a term is elaborated or discussed herein. A recital of one or more synonyms does not exclude the use of other synonyms. The use of examples anywhere in this specification, including examples of any terms discussed herein, is intended to be illustrative only. These examples are not intended to limit the scope and meaning of the disclosure or of any exemplified term. Likewise, the disclosure is not limited to the various embodiments described below.

System Topology Overview

FIG. 1 is a generalized illustration of an internal network 100, such as an enterprise network. An internal network (also referred to as a "private network") is a network that is accessible only to a limited set of authorized users. Generally, a wide range of information and services are available to authorized users that would not be available to the public from the Internet, such as an enterprise's internal Information Technology (IT) systems. Accordingly, an internal network can constitute an important focal point of internal communication and collaboration by providing a single point by which to access internal resources and/or external resources.

Internal networks (which often use private Internet Protocol (IP) address spaces) are commonly used for home, office, and enterprise local area networks (LANs). As noted above, the internal network 100 is generally accessible only to a limited set of authorized users (e.g., employees of an enterprise), each of whom has at least one valid identity stored on a directory server 102. In some embodiments the directory server 102 is managed by the enterprise associated with the internal network 100, while in other embodiments the directory server 102 is managed by some other entity.

The directory server 102 (also called a "domain controller") can include a main identity database 104 that is used to facilitate a directory service for the internal network 100. For example, the directory server 102 could facilitate the Active Directory (AD) service if the internal network 100 is a Microsoft Windows® domain network. The directory server 102 (and, more specifically, the main identity database 104) is accessible to one or more endpoint devices 112 that reside within the internal network 100. An endpoint device is a network-connected computer hardware device, such as a desktop computer, laptop computer, tablet computer, mobile phone, or other specialized hardware.

The directory server 102 includes the valid identities for all authorized users of the internal network 100, and thus is able to enforce security policies for the endpoint device(s) 112 by authenticating/authorizing users are they attempt to access the internal network 100. More specifically, when a user logs into an endpoint device that is part of the internal network 100, the directory service compares the submitted credentials (e.g., username and password) to the main identity database 104 in order to determine whether the user is authorized to access internal network resources.

The directory server 102 is accessible to a virtual machine 106 that includes one or more programs/routines for applying artificial intelligence (AI) algorithm(s) to understand the topology of the internal network 100. Other embodiments of the virtual machine 106 may include security programs/routines for creating fictitious network identities, as described in U.S. patent application Ser. No. 15/588,280, titled "CREATION OF FICTITIOUS IDENTITIES TO OBFUSCATE HACKING OF INTERNAL NETWORKS," which is incorporated by reference herein in its entirety. More specifically, the virtual machine may inject one or more fictitious network identities (which cannot be used to gain access to the internal network 100) into an operating system process responsible for enforcing a security policy on the computing device. For example, if the computing device executes a Microsoft Windows® operating system, then the operating system process may be the Local Security Authority Subsystem Service (LSASS).

A network administrator can physically or virtually install the virtual machine 106 on a computing device within the internal network 100, and then configure the virtual machine 106 specifically for the internal network 100. For example, the virtual machine 106 may be installed on a server 110 or an endpoint device, such as a mobile phone, tablet computer, laptop computer, personal computer, etc. The network administrator may be associated with the enterprise, a network service responsible for managing the internal network 100, or a security service responsible for managing the virtual machine 106. The virtual machine 106 can read elements (e.g., computer metadata and/or users' metadata) from the main identity database 104 of the directory server 102 in order to model the internal network 100. However, the main identity database 104 is generally left unchanged (i.e., the virtual machine 106 typically uses the main identity database 104 as a read-only element for modeling).

Modeling may be driven by a security engine 108 that is executed by the virtual machine and employs AI algorithms to learn the characteristics of the internal network 100. For example, various machine learning algorithms/techniques could be employed by the security engine 108, including Naïve Bayes Classifier algorithms, K Means Clustering algorithms, Support Vector Machine algorithms, linear regression, logic regression, artificial neural networks, etc. These algorithms/techniques may be chosen based on application (e.g., supervised or unsupervised learning). Moreover, these algorithms/techniques could be optimized based on feedback from the network administrator as to whether the topology of the internal network 100 has been correctly modeled. Accordingly, the security engine 108 can model existing network elements (e.g., authorized identified for valid users) and create new network elements for the purpose of deception, monitoring, etc.

Once the virtual machine 106 has been installed and configured, the security engine 108 can fetch the necessary information from the main identity database 104 on the directory server 102. For example, the virtual machine 106 may retrieve examples of valid identities in order to discover the syntax of the valid identities. The syntax may be influenced by different naming techniques and/or stylistic markers that must be mimicked in order to create convincing fictitious identities. The security engine 108 can then perform an analysis of the internal network 100 using AI algorithm(s) that take into account the syntax of the valid identities stored in the main identity database 104.

In some embodiments, the virtual machine 106 is associated with a security service (i.e., an individual or an enterprise) that is responsible for overseeing implementation of the techniques described herein. However, the security service typically has a limited presence on the internal network 100 that is largely or entirely invisible to authorized users of the internal network 100. For example, the security service's only presence may be the virtual machine 106 and portions of code that injected into the memory of the computing devices (e.g., the server and the endpoint device(s) 112) that reside within the internal network.

Information that is learned by the virtual machine 106 from its implementation in the internal network 100 could be used by the security service to improve the security technique(s) used to protect the internal network 100 or some other network (e.g., the internal network of another enterprise). Said another way, the security service can improve the ability of the virtual machine 104 (and, more specifically, the security engine 108) to detect and react to network threats by learning from one or more unrelated internal networks over time.

Learning of the topology also does not infringe upon the composition of the internal network 100 as a whole or the ability of authorized users to continue legitimate usage of the internal network 100. Instead, the security techniques described herein may be entirely or substantially unobservable/unnoticeable to authorized users of the internal network 100 (e.g., employees of an enterprise).

Note that in some embodiments a network-connected server associated with the security service implements the technique(s) without causing any change to the general topology of the internal network 100. Accordingly, the topology of the internal network 100 may remain substantially undisturbed even though the internal network 100 has increased visibility to a security service, increased protection from unauthorized users, etc.

Figure 2A:
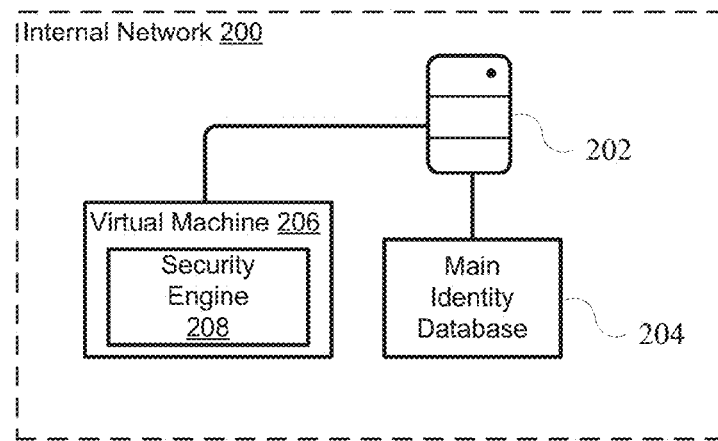
FIG. 2A illustrates a first step of a process for modeling an internal network.
Figure 2B:
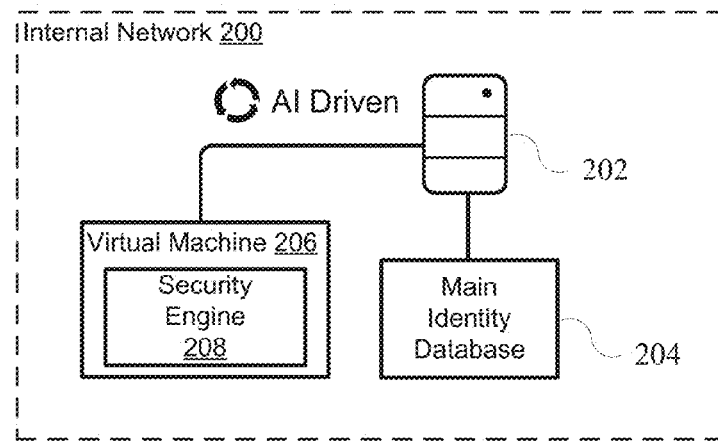
FIG. 2B illustrates a second step of the process for modeling the internal network.
Figure 2C:
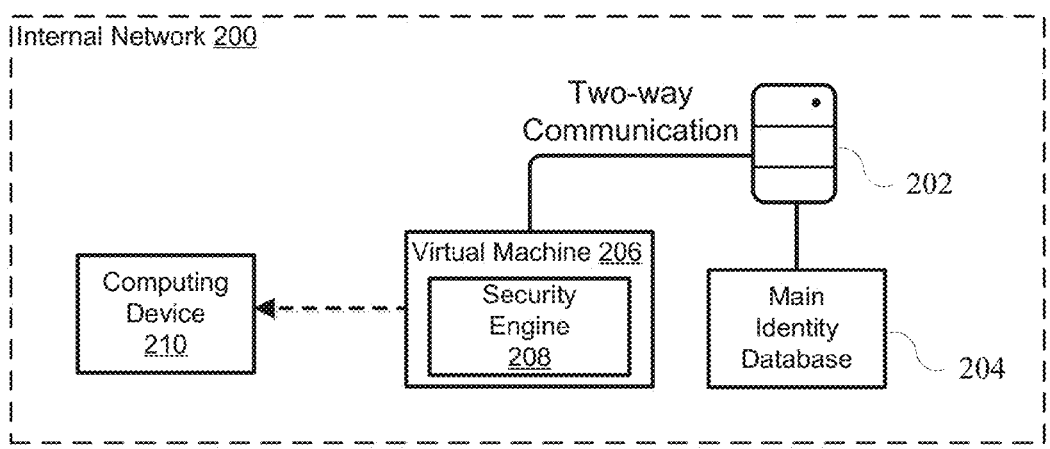
FIG. 2C illustrates a third set of the process for modeling the internal network.

FIGS. 2A-C illustrate multiple steps of a process for modeling an internal network 200 using a virtual machine 206 that employs one or more AI algorithms. The virtual machine 206 can include core software for executing security technique(s) that protect the internal network 200 from threats, such as hackers attempting to penetrate the internal network 200 and exfiltrate sensitive data.

As noted above, a network administrator can physically or virtually install the virtual machine 206 in the internal network 200. In some instances, the virtual machine 206 may need to be configured specifically for the internal network 200. For example, the network administrator may need to specify where a directory server 202 resides (e.g., by providing a network address) that includes a main database of identities 204 associated with authorized users of the internal network 200.

The main identity database 204 (also referred to as the "customer main identity database") may be part of the internal network 200, and the main identity database 204 can be made accessible to the virtual machine 206. Generally, the virtual machine 206 will have read-only access to the directory server 202 (i.e., the virtual machine will not be able to effect changes to the main identity database 204). For example, the directory server 202 could be an Active Directory (AD) server that authenticates/authorizes users attempting to access a Microsoft Windows® domain network.

As shown in FIG. 2B, once the virtual machine 206 has been installed and configured for the internal network 200, the virtual machine 206 (or, more specifically, a security engine 208) can execute one or more algorithms to model network elements. For example, the security engine 208 may fetch information from the directory server 202 to determine a syntax for valid credentials corresponding to authorized users of the internal network 200. The syntax may be influenced by different naming techniques and/or stylistic markers used by the valid credentials.

The security engine 208 can continuously analyze the main identity database 204 of the directory server 202 using, for example, AI-driven algorithm(s). For example, such analysis allows the security engine 208 to detect when an enterprise modifies its syntax for valid employee credentials from first_name@enterprise.com to first_name.last_name@enterprise.com. Thus, the security engine 208 can detect syntax changes in the valid credentials corresponding to authorized users of the internal network 200.

The security engine 208 may use the information derived from the analysis to craft executables that are implemented within the internal network 200. For example, bogus network identities intended to obfuscate hackers could be created that mimic the syntax used by the directory server 202. Thus, bogus identities created by the security engine 208 and authentic identities maintained within the main identity database 204 may be entirely or substantially indistinguishable from one another. Said another way, an AI-driven security engine 208 may create an analysis of the network identities that is used by the security engine 208 (or some other virtual machine) to create fictitious network identities that are outmost similar to the authentic network identities stored in the main identity database 204. The security engine 208 is able to accomplish this by obtaining information directly from the directory server 202 regarding the topology of the internal network 200, such as identity names, particular attributes (e.g., permissions), etc.

The information fetched from the directory server 202 may be analyzed by the security engine 208, which can create a controlled array of supplemental information that is outmost similar, but not necessarily identical, to the information obtained from the directory server 202. That is, the security engine 208 (or some other module of the virtual machine 206) may create supplemental information that is modeled based on pattern(s) discovered in the information already residing within the internal network 200. Some or all of the supplemental information could be transmitted to other computing devices residing within the internal network 200 and/or an external storage system residing outside of the internal network 200. Generally, the algorithm-driven security engine 208 will adhere to any development in the internal network 200 and will adjust its output based upon such adjustments.

The algorithm(s) executed by the virtual machine 206 could utilize artificial intelligence (AI), data mining, and/or machine learning techniques. These techniques may enable the virtual machine 206 to more accurately predict, and readily respond to, changes in the pattern(s) used to model the supplemental information and/or attempts to penetrate the internal network 200. AI algorithms may complement human oversight (e.g., by the network administrator) by intelligently analyzing usage of the internal network 200, attempts to access the internal network 200 using authentic/fictitious network identities, etc. Accordingly, the virtual machine 206 may apply AI-driven analytics to identify threats to the internal network 200.

In some embodiments, the virtual machine 206 may notify a network administrator of an attempt to breach the internal network 200 using supplemental information (e.g., fictitious network identities) injected into the internal network 200 by the virtual machine 206. Similarly, the virtual machine 206 may notify the network administrator whenever a modification has been made to the model of the internal network 200. Notifications may be completed via email message, text message, push notification, software program alert, automated voicemail, etc.

As shown in FIG. 2C, AI-driven algorithm(s) allow the virtual machine 206 to readily adapt to changes in the internal network 200 and/or the main identity database 204. The AI-driven algorithm(s) typically facilitate two-way communication between the virtual machine 206 and the directory server 202 so that the virtual machine 206 can react to changes made anywhere in the internal network 200. For example, the virtual machine 206 may update a model of the internal network 200 responsive to any changes within the network. This can be accomplished because changes made to network identities on any computing device residing within the internal network 200 may be pushed back to the directory server 202.

The connection between the virtual machine 206 and the directory server 202 may be viewed as a continuous thread. Consequently, when an object within the main identity database 204 is changed, the virtual machine 206 may automatically execute the AI-driven algorithm(s) to react to such changes in the main identity database 204. Alternatively, the virtual machine 206 could execute the AI-driven algorithm(s) periodically. For example, in some embodiments the virtual machine 206 executes the AI-driven algorithm(s) upon the expiration of a specified time period (e.g., every 12 hours), while in other embodiments the virtual machine 206 executes the AI-driven algorithm(s) upon the occurrence of another type of event (e.g., whenever the number of users who have attempted to access the internal network 200 reaches a certain threshold). Any updates that are determined to be necessary can then be pushed to one or more computing devices 210 within the internal network 200.

FIG. 3 depicts a flow diagram of a process 300 for implementing a virtual machine that employs different algorithm(s) to learn the internal topology of a network. The network is typically a private network (e.g., a home, office, or enterprise network).

Initially, a virtual machine that includes a security engine (also referred to as a "security module") is installed on a computing device that resides within the network (step 301). As noted above, the security module could additionally or alternatively be installed on a security server that is communicatively coupled to the network via a secure link. The computing device may be a server or an endpoint device (e.g., a desktop computer, laptop computer, tablet computer, mobile phone, or other specialized hardware) that resides within the network. Connecting to the network generally allows the computing device to access sensitive information. Thus, such a connection may be modeled/monitored in order to provide protection from unauthorized users (e.g., hackers).

The virtual machine can then be communicatively coupled to at least one network device (step 302). Said another way, the virtual machine can be provided access to one or more network devices residing within the network. Examples of network devices include servers, endpoint devices, and directory servers that includes an identity database.

Once installed, the virtual machine can be configured for the network. More specifically, the security module can execute one or more algorithms for modeling network element(s) hosted by the at least one network device (step 303). Examples of network elements include authentic network identities and valid credentials for the authentic network identities. In some embodiments, the security module acquires data associated with the network and analyze the data to recognize pattern(s), such as naming patterns (e.g., credential/identity syntax), site name/subnet patterns, or application/attribute patterns.

The algorithm(s) could utilize artificial intelligence, data mining, and/or machine learning techniques. By modeling the network and identifying relevant patterns, the security module may be able to more accurately predict, and readily respond to, changes in the pattern(s) that are indicative of attempts to penetrate the network. For example, an accurate model of the network may permit the security model to quickly detect attempts to access the network using identities/credentials (e.g., fictitious identities) that do not match the model.

The model of the network and/or characteristics learned during examination/modeling of the network can be used to perform a system operation (step 304). For example, the virtual machine may be configured to craft an executable having a masked topology that is based on the pattern(s) recognized by the security module. As another example, the virtual machine (or some other virtual machine) can employ certain security technique(s) intended to protect the network based on the recognized pattern(s). Possible system operations include crafting executables with a masked topology, injecting supplemental information into the network, and facilitating local proxy detection.

Execution of the algorithm(s) also allows the security module to adapt to changes in the network and/or the identity database to which the security module is communicatively coupled. In some embodiments, the security module continually/periodically monitors whether changes have been made to the network elements upon which the model is based (step 305). For example, the security engine may detect when an enterprise modifies the syntax of valid credentials for authorized users (e.g., syntax modified from first_name@enterprise.com to first_name.last_name@enterprise.com). In some embodiments the security module is configured to monitor whether changes have been made to any of the network elements, while in other embodiments the security module is configured to monitor whether changes have been made to a certain subset of the network elements (e.g., only the valid credentials for authorized users having a particular characteristic).

Responsive to detecting that a change has been made, the security module can update the model as necessary (step 306). The model may be updated in real time if the security module continually examines the network elements for changes.

Unless contrary to physical possibility, it is envisioned that the steps described above may be performed in various sequences and combinations. For example, in some embodiments executables with masked topology are created prior to the security module being installed on a computing device that resides within the network. That is, some or all of the executables may be pre-set.

Additional steps could also be included in some embodiments. For example, the security module may continually or periodically update supplemental information (e.g., fictitious identities/credentials) injected into the network when one of the recognized patterns is modified. Thus, supplemental information intended to, for example, obfuscate hackers can be updated so that it consistently mimics authentic information residing within the network.

Moreover, in some embodiments, the connection between the security module and the identity database is a continuous thread, which ensures that changes made to the identity database are acknowledged in near real time. The security module may globally effect changes within the network in response to determining a change has been made to the identity database. The security module may automatically execute some or all of the algorithm(s) for modeling the network upon determining that an object within the identity database has been changed (e.g., added, removed, or modified).

Figure 4A:
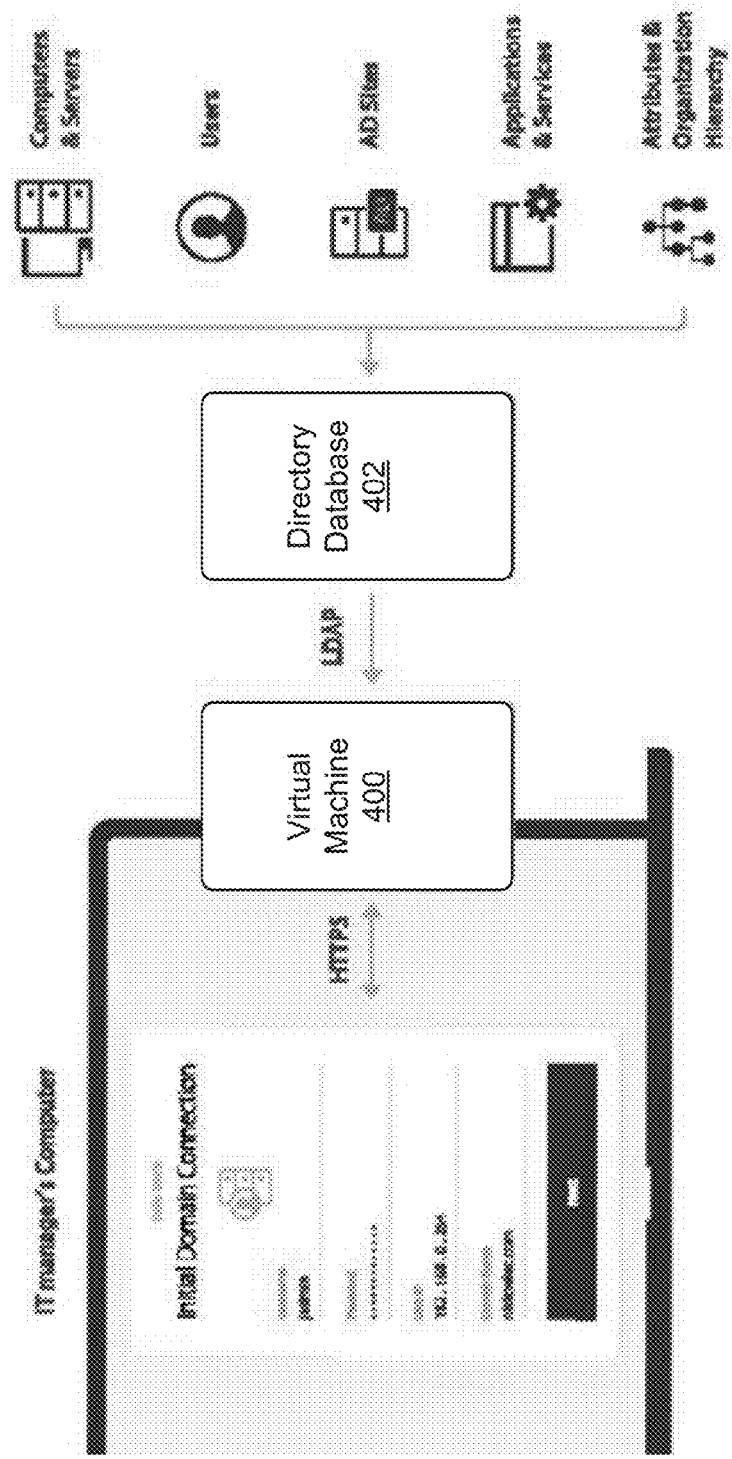
FIG. 4A depicts how a virtual machine can collect data regarding a network.
Figure 4B:
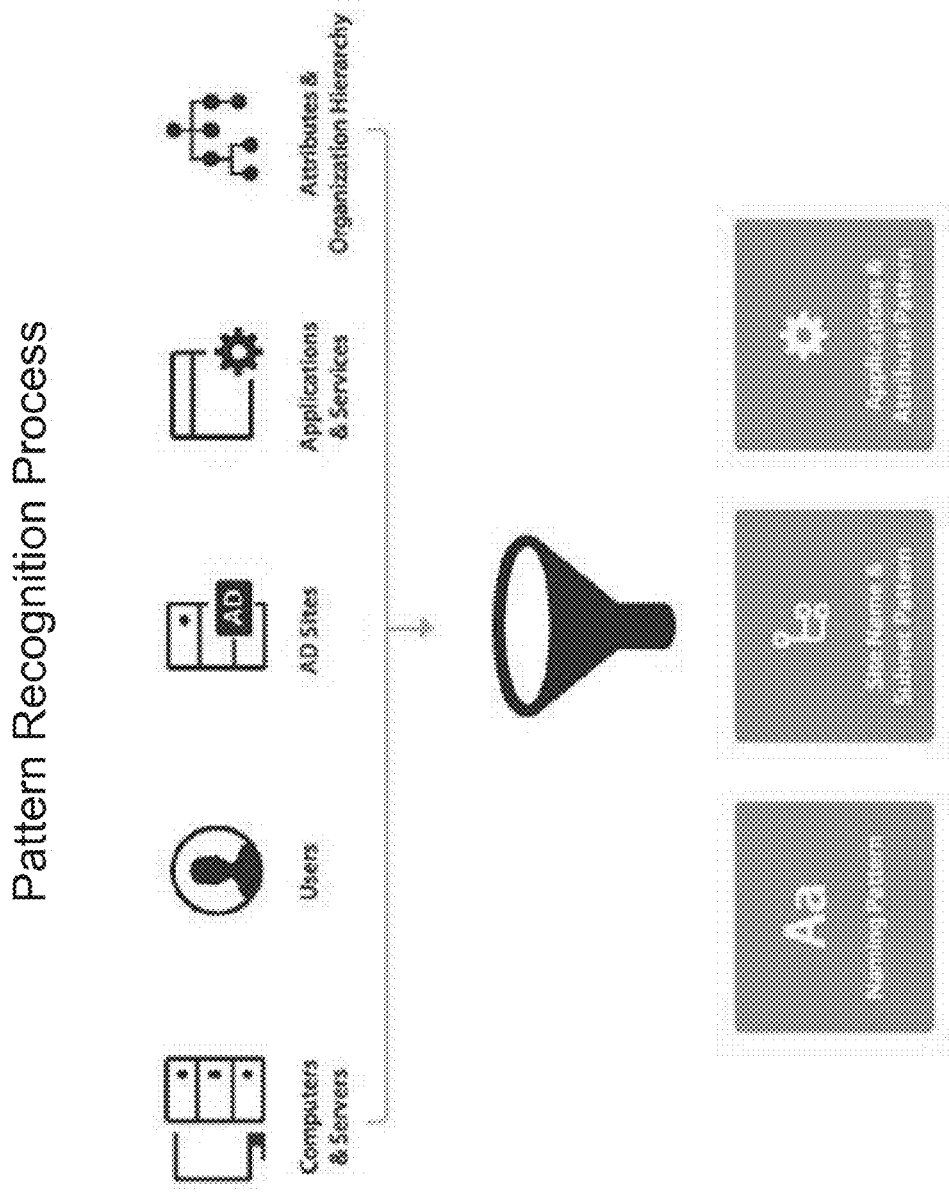
FIG. 4B depicts how data collected by a virtual machine can be analyzed using one or more algorithms to identify pattern(s) within the data.
Figure 4C:
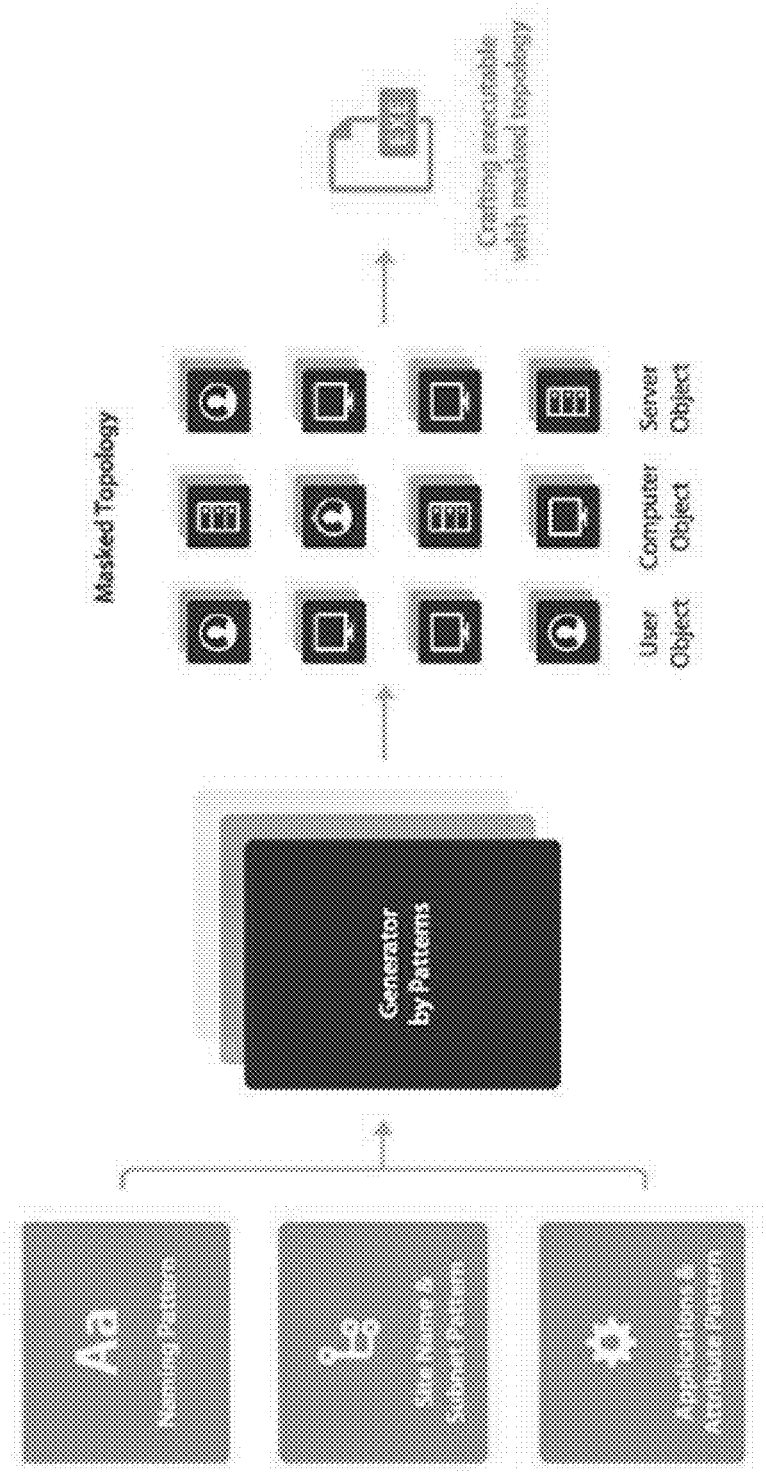
FIG. 4C depicts how subsequent tasks performed by the virtual machine can be intelligently masked.

FIGS. 4A-C depict how a virtual machine 400 can collect data regarding a network, recognize pattern(s) within the data, and mask subsequent tasks performed by the virtual machine.

As shown in FIG. 4A, the virtual machine 400 initially connects to a directory database 402 (e.g., an Active Directory database for a Microsoft Windows® domain network) so that data can be collected from the directory database 402. For example, the virtual machine 400 may establish a link via the Lightweight Directory Access Protocol (LDAP), which is a directory service protocol that runs above the TCP/IP stack. The data collected by the virtual machine, meanwhile, could include information regarding computing devices (e.g., computers and servers) that reside within the network, users of the network (e.g., authorized identities and valid credentials), directory sites, applications/services that make use of the network, network attributes/topology, organization hierarchy, etc.

Moreover, the virtual machine 400 may be communicatively accessible to a computing device associated with a network administrator (also referred to as an "Information Technology (IT) manager"). For example, the network administrator may be able to access a user interface through which she can input commands or otherwise alter how the virtual machine 400 operates. Those skilled in the art will recognize that the virtual machine 400 may reside on the computing device associated with the network administrator. In such instances, the virtual machine 400 can interface directly with the operating system of the computing device.

Communications between the virtual machine 400 and the computing device of the network administrator may be exchanged via Hypertext Transfer Protocol (HTTP) within a connection encrypted by Transport Layer Security (TLS) or Secure Sockets Layer (SSL). Such a protocol is often referred to as "HTTPS." HTTPS is a communications protocol for secure communication over a network and is widely used on the Internet.

As shown in FIG. 4B, after the data has been collected by the virtual machine, the data can be analyzed using one or more algorithms to identify pattern(s) within the data. The algorithm(s) executed by the virtual machine 400 could utilize artificial intelligence (AI), data mining, and/or machine learning techniques. In some embodiments, a specific module of the virtual machine 400 (e.g., a security module or a recognition module) is responsible for analyzing the data and recognizing any pattern(s) present within the data. Patterns could be associated with naming schemes (e.g., credential/identity syntaxes), site names, subnet structures, or application names/logic, network attributes, etc. These techniques may enable the virtual machine 400 to more accurately predict, and readily respond to, changes in the pattern(s) used to model the network.

As shown in FIG. 4C, any recognized pattern(s) can be used by the virtual machine to perform a task. Knowledge of the pattern(s) used within the network may enable the virtual machine to add supplemental information to the network that is substantially indistinguishable from authentic information already existing in the network. For example, the virtual machine could craft an executable based on masked topology (e.g., user objects, computer objects, and/or server objects) that appears to be an authentic network executable. The crafted executable can be injected into the network (e.g., placed on a computing device that resides within the network) and monitored to detect occurrences of security-related events. For example, if the crafted executable includes a fictitious network identity, the virtual machine can monitor attempts to access the network using the fictitious network identify (which are indicative of unauthorized user(s) attempting to penetrate the network). Because the algorithm(s) can continuously monitor the network (e.g., by continually collecting and analyzing data within the directory database 402), any changes in the recognized pattern(s) can also be globally effected in near real time.

Processing System

Figure 5:
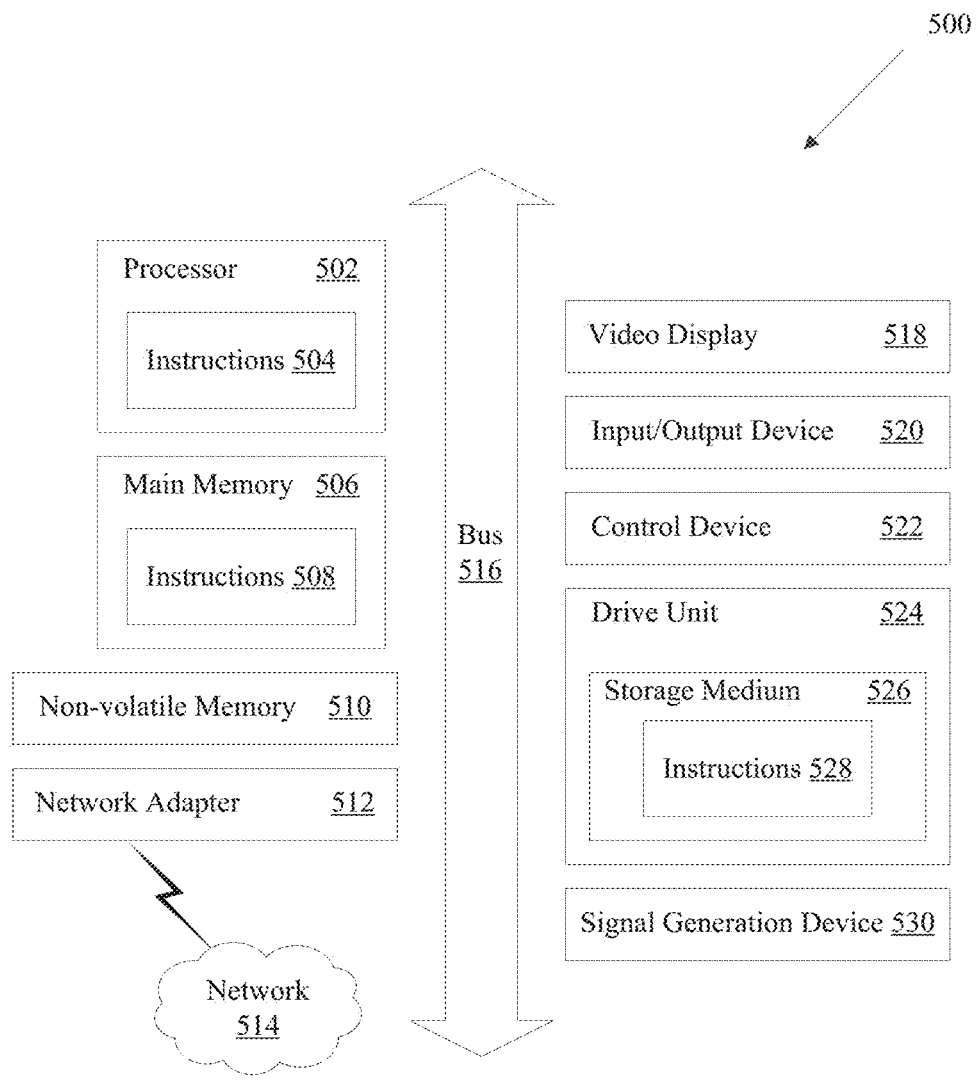
FIG. 5 is a block diagram illustrating an example of a processing system in which at least some operations described herein can be implemented.

FIG. 5 is a block diagram illustrating an example of a processing system 500 in which at least some operations described herein can be implemented. The processing system 500 shown here includes one or more central processing units ("processors") 502, main memory 506, non-volatile memory 510, network adapter 512 (e.g., network interfaces), video display 518, input/output devices 520, control device 522 (e.g., keyboard and pointing devices), drive unit 524 including a storage medium 526, and signal generation device 530 that are communicatively connected to a bus 516. Other embodiments of the processing system 500 may include some or all of these components, as well as other components not shown here.

The bus 516 is illustrated as an abstraction that represents one or more physical buses and/or point-to-point connections that are connected by appropriate bridges, adapters, or controllers. Therefore, the bus 516 can include a system bus, Peripheral Component Interconnect (PCI) bus or PCI-Express bus, HyperTransport interface, Industry Standard Architecture (ISA) bus, Small Computer System interface (SCSI) bus, Universal Serial Bus (USB), inter-Integrated Circuit (I2C or $I^2C$) bus, or Institute of Electrical and Electronics Engineers (IEEE) standard 1394 bus (also referred to as "Firewire").

In various embodiments, the processing system 500 operates as part of a standalone computing device residing within a network, while in other embodiments the processing system 500 is connected to a computing device residing within the network via a wired channel or a wireless channel. Accordingly, the processing system 500 may be part of mobile phone, personal computer, tablet computer, personal digital assistant (PDA), game console (e.g., Sony PlayStation® or Microsoft Xbox®), music player (e.g., Apple iPod Touch®), wearable electronic device (e.g., a watch or fitness band), network-connected ("smart") device (e.g., a television or home assistant device), virtual/augmented reality systems (e.g., a head-mounted display such as Oculus Rift® and Microsoft Hololens®), or another electronic device capable of executing a set of instructions (sequential or otherwise) that specify action(s) to be taken by the processing system 500.

While the main memory 506, non-volatile memory 510, and storage medium 526 (also called a "machine-readable medium) are shown to be a single medium, the term "machine-readable medium" and "storage medium" should be taken to include a single medium or multiple media (e.g., a centralized or distributed database, and/or associated caches and servers) that store one or more sets of instructions 528. The term "machine-readable medium" and "storage medium" shall also be taken to include any medium that is capable of storing, encoding, or carrying a set of instructions for execution by the processing system 500.

In general, the routines executed to implement the embodiments of the disclosure may be implemented as part of an operating system process or a dedicated application, component, program, object, module, or sequence of instructions (which are collectively referred to as "computer programs"). The computer programs typically comprise one or more instructions (e.g., instructions 504, 508, 528) set at various times in various memory and storage devices in a computing device. When read and executed by the processor(s) 502, the instruction(s) cause the processing system 500 to perform operations to execute elements involving various aspects of the embodiments.

Moreover, while certain embodiments have been described in the context of fully functioning computing devices, those skilled in the art will appreciate that the various embodiments are capable of being distributed as a software program product in a variety of forms. The disclosure applies regardless of the particular type of machine or computer-readable media used to actually effect the distribution.

Further examples of machine-readable (storage) media include, but are not limited to, recordable media such as volatile and non-volatile memory devices 510, floppy disks and other removable disks, hard disk drives, optical disks (e.g., Compact Disk Read-Only Memory (CD-ROMS) and Digital Versatile Disks (DVDs)), and transmission media, such as digital communication links and analog communication links.

The network adapter 512 enables the processing system 500 to mediate data in a network 514 with an entity that is external to the processing system 500 through any communication protocol supported by the processing system 500 and the external entity. For example, the processing system 500 and the external entity may communicate via Wi-Fi, Bluetooth®, NFC, cellular, infrared, RFID, etc. Accordingly, the network adapter 512 can include a network adaptor card, a wireless network interface card, a router, an access point, a wireless router, a switch, a multilayer switch, a protocol converter, a gateway, a bridge, bridge router, a hub, a digital media receiver, a repeater, or some combination thereof.

In some embodiments, the network adapter 512 includes a firewall that governs and/or manages permission to access/proxy data in a computer network, and tracks varying levels of trust between different machines and/or applications. The firewall can include any number of modules having combinations of hardware component(s) and/or software component(s) able to enforce a specified set of access rights. The firewall may also manage (or have access to) an access control list that details permissions, including the access/operation rights of an object by an individual, a machine, and/or an application, and the circumstances under which the permission rights stand.

The techniques introduced here implemented by, for example, programmable circuitry (e.g., one or more microprocessors) programmed with software and/or firmware, entirely in special-purpose hardwired (i.e., non-programmable) circuitry, or in a combination of such forms. Circuitry can be in the form of application-specific integrated circuits (ASIC s), programmable logic devices (PLDs), field-programmable gate arrays (FPGAs), etc.

Remarks

The foregoing description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe the principles of the invention and its practical applications, thereby enabling those skilled in the relevant art to understand the claimed subject matter, the various embodiments, and the various modifications that are suited to the particular uses contemplated.

Although the Detailed Description describes certain embodiments and the best mode contemplated, the technology can be practiced in many ways no matter how detailed the Detailed Description appears. Embodiments may vary considerably in their implementation details, while still being encompassed by the specification. Particular terminology used when describing certain features or aspects of various embodiments should not be taken to imply that the terminology is being redefined herein to be restricted to any specific characteristics, features, or aspects of the technology with which that terminology is associated. In general, the terms used in the following claims should not be construed to limit the technology to the specific embodiments disclosed in the specification, unless those terms are explicitly defined herein. Accordingly, the actual scope of the technology encompasses not only the disclosed embodiments, but also all equivalent ways of practicing or implementing the embodiments.

The language used in the specification has been principally selected for readability and instructional purposes. It may not have been selected to delineate or circumscribe the subject matter. It is therefore intended that the scope of the technology be limited not by this Detailed Description, but rather by any claims that issue on an application based hereon. Accordingly, the disclosure of various embodiments is intended to be illustrative, but not limiting, of the scope of the technology as set forth in the following claims.

What is claimed is:

1. A computer-implemented method for modeling an internal network, the method comprising:
  causing a security module to be installed on a computing device executing a Microsoft Windows operating system,
  wherein the computing device resides within an internal network;
  establishing a communication link between the security module and an Active Directory database that includes valid network identities used to facilitate a directory service for the internal network;
  executing one or more algorithms that identify common characteristics of the valid network identities;
  creating a model of the valid network identities based on the common characteristics;
  continually monitoring whether changes have been made to the valid network identities; and
  in response to determining that a change was made to a valid network identity,
  modifying the model of the valid network identities to account for the change.

2. The computer-implemented of claim 1, wherein the security module is executed by a virtual machine hosted on the computing device.

3. The computer-implemented method of claim 1, further comprising:
  injecting supplemental information into an operating system process responsible for enforcing a security policy on the computing device;
  determining that an attempt was made to access the internal network using the supplemental information; and
  notifying a network administrator of the attempt.

4. The computer-implemented method of claim 3, wherein the operating system process includes one or more valid identities corresponding to one or more authenticated users of the internal network.

5. The computer-implemented method of claim 3, wherein the computing device executes a Microsoft Windows operating system, and wherein the operating system process is a Local Security Authority Subsystem Service (LSASS).

6. The computer-implemented method of claim 3, wherein the attempt to access the internal network is indicative of an unauthorized entity attempting to breach the internal network.

7. The computer-implemented method of claim 3, wherein the network administrator is responsible for managing the internal network, the security module, or both.

8. The computer-implemented method of claim 1, wherein the computing device is a server or an endpoint device.

9. A computer-implemented method comprising:
  installing a virtual machine on a computing device that resides within a network;
  communicatively coupling the virtual machine to an identity database that includes valid network identities used to facilitate a directory service for the network;
  executing an algorithm that identifies common characteristics of the valid network identities;
  creating a model of the valid network identities based on the common characteristics;
  performing a system operation using the model;
  continually monitoring whether changes have been made to any of a subset of the valid network identities; and
  in response to determining that a change was made to a valid network identity included in the subset, modifying the model of the valid network identities to account for the change.

10. The computer-implemented method of claim 9, wherein the network is an internal network associated with an enterprise.

11. The computer-implemented method of claim 9, wherein the algorithm employs artificial intelligence techniques, data mining techniques, machine learning techniques, or some combination thereof.

12. The computer-implemented method of claim 9, wherein creating the model of the valid network identities comprises:
  parsing the valid network identities to identify an identity syntax; and
  crafting an executable in accordance with the identity syntax so that the executable is indistinguishable from authentic executables maintained by the computing device.

13. The computer-implemented method of claim 9, wherein the subset includes valid network identities having a specified characteristic.

14. The computer-implemented method of claim 9, further comprising:
  notifying a network administrator of an occurrence of said modifying.

15. The computer-implemented method of claim 14, wherein notifying the network administrator comprises performing at least one of:
  transmitting an email message to an email address associated with the network administrator;
  transmitting a text message to a phone number associated with the network administrator;
  causing a push notification to be presented by an application running on a user device associated with the network administrator; and
  causing an alert to be generated by a software program running on a user device associated with the network administrator.

16. A computer-implemented method comprising:
  installing a virtual machine on a computing device that resides within a network;
  communicatively coupling the virtual machine to an identity database that includes valid network identities used to facilitate a directory service for the network;
  executing an algorithm that identifies common characteristics of the valid network identities;
  creating a model of the valid network identities based on the common characteristics, wherein creating the model of the valid network identities comprises parsing the valid network identities to identify an identity syntax, and crafting an executable in accordance with the identity syntax so that the executable is indistinguishable from authentic executables maintained by the computing device; and
  performing a system operation using the model.

17. The computer-implemented method of claim 16, wherein the network is an internal network associated with an enterprise.

18. The computer-implemented method of claim 16, wherein the algorithm employs artificial intelligence techniques, data mining techniques, machine learning techniques, or some combination thereof.

19. The computer-implemented method of claim 16, further comprising:
  continually monitoring whether changes have been made to any of a subset of the valid network identities; and
  in response to determining that a change was made to a valid network identity included in the subset, modifying the model of the valid network identities to account for the change.

20. The computer-implemented method of claim 19, wherein the subset includes valid network identities having a specified characteristic.

21. The computer-implemented method of claim 19, further comprising:
  notifying a network administrator of an occurrence of said modifying.

22. The computer-implemented method of claim 21, wherein notifying the network administrator comprises performing at least one of:
  transmitting an email message to an email address associated with the network administrator;
  transmitting a text message to a phone number associated with the network administrator;
  causing a push notification to be presented by an application running on a user device associated with the network administrator; and
  causing an alert to be generated by a software program running on a user device associated with the network administrator.

* * * * *